United States Patent [19]

Fleming, Jr. et al.

[11] Patent Number: 5,294,570

[45] Date of Patent: Mar. 15, 1994

[54] REDUCTION OF FOREIGN PARTICULATE MATTER ON SEMICONDUCTOR WAFERS

[75] Inventors: Marshall J. Fleming, Jr., Underhill; William A. Syverson, Colchester; Eric J. White, Essex Junction, all of Vt.

[73] Assignee: International Business Machines Corporation, Armonk, N.Y.

[21] Appl. No.: 827,846

[22] Filed: Jan. 29, 1992

Related U.S. Application Data

[63] Continuation of Ser. No. 588,228, Sep. 26, 1990, abandoned.

[51] Int. Cl.$^5$ .......................................... H01L 21/306
[52] U.S. Cl. ..................... 437/239; 437/946; 134/3; 134/28
[58] Field of Search ............... 139/3, 28; 437/946, 437/239

[56] References Cited

U.S. PATENT DOCUMENTS

| | | | |
|---|---|---|---|
| 2,809,103 | 10/1957 | Alexander | 41/42 |
| 4,100,014 | 7/1978 | Kuhn-Kuhnenfeld et al. | 156/645 |
| 4,220,706 | 9/1980 | Spak | 430/318 |
| 4,261,791 | 4/1981 | Shwartzman | 156/628 |
| 4,681,657 | 7/1987 | Hwang et al. | 156/657 |
| 4,705,760 | 11/1987 | Kaganowicz et al. | 437/234 |
| 4,711,256 | 12/1987 | Kaiser | 134/25.4 |
| 4,828,751 | 5/1989 | Kremer | 252/171 |
| 5,181,985 | 1/1993 | Lampert et al. | 134/31 |

FOREIGN PATENT DOCUMENTS

| | | | |
|---|---|---|---|
| 1-265521 | 10/1989 | Japan | 134/3 |
| 989025 | 4/1965 | United Kingdom . | |

OTHER PUBLICATIONS

Kern, W., "Hydrogen Peroxide Solutions For Silicon Wafer Cleaning", RCA Engineer, 28-4 (Jul.-Aug. 1983), pp. 99-105.

Bansal, I., "Particle Contamination During Chemical Cleaning and Photoresist Stripping of Silicon Wafers", Microcontamination (Aug./Sep. 1984), pp. 35-39 and 90.

Ohsawa, et al., "Improvements of Trench Capacitor Characteristics By Pre-Oxidation Surface Cleaning With A $HNO_3$-HF-$H_2O$ Solution", International Electron Devices Meeting, San Francisco, Dec. 11-14, 1988, IEEE (Dec. 1988), pp. 726-729.

Shibata, et al., "Si Surface Cleaning and Epitaxial Growth of GaAs on Si by Electron Cyclotron Resonance Plasma-Excited M-B-E at low Temperatures", J. of the Electrochemical Soc., vol. 136, No. 11 (Nov. 1989), pp. 3459-3462.

Valco, et al., "Plasma Deposited Silicon Nitride for Indium Phosphide Encapsulation", J. of the Electrochemical Soc., vol. 136, No. 1 (Jan. 1989), pp. 175-182.

*Primary Examiner*—Olik Chaudhuri
*Assistant Examiner*—Ourmazd S. Ojan
*Attorney, Agent, or Firm*—William D. Sabo

[57] ABSTRACT

A substantial reduction in the foreign particulate matter contamination on surfaces, such as the surfaces of semiconductor wafers, is achieved by treating the surfaces with a solution comprising a strong acid and a very small amount of a fluorine-containing compound. A preferred method employs a solution containing sulfuric acid, hydrogen peroxide and a very small amount of hydrofluoric acid, which is effective in reducing foreign particulate matter contamination, without significant etching, of the surface being treated.

15 Claims, No Drawings

REDUCTION OF FOREIGN PARTICULATE MATTER ON SEMICONDUCTOR WAFERS

This is a continuation of copending application Ser. No. 07/588,228 filed on Sept. 26, 1990, now abandoned.

BACKGROUND OF THE INVENTION

1. Technical Field

This invention relates to the cleaning of surfaces, and, more particularly, to an improved method of reducing foreign particulate matter on surfaces of semiconductor wafers.

2. Description of the Prior Art

In the manufacture of semiconductor devices, cleaning steps are performed before or after various steps to remove foreign contaminants or impurities from the surfaces of semiconductor wafers. For example, wafers are commonly polished with abrasive slurries to produce smooth, polished surfaces; after polishing, it is necessary to remove the slurry and other surface contaminants from the wafers. Removal of foreign particulate matter, such as metallics and organic contaminants, is also required prior to high temperature processing steps, such as diffusion, thermal oxidation and epitaxial growth; otherwise, these impurities can adversely affect surface stability, reliability, electrical performance and production yield of devices. Cleaning steps are also commonly carried out after stripping photoresist materials from the surfaces of wafers and following etching steps.

Various techniques are used to clean foreign particulate matter from the surfaces of semiconductor wafers, such as chemical removal, centrifugation, air-stream or water jet cleaning, mechanical scrubbing and so forth. One commonly used chemical cleaning solution contains sulfuric acid and hydrogen peroxide (see, for example, Kern, W., "Hydrogen Peroxide Solutions For Silicon Wafer Cleaning", RCA Engineer 28-4 (July/August, 1983), pp. 99-105), but that solution is somewhat limited in its foreign particulate matter removal effectiveness. Other methods employing various cleaning solutions are exemplified by the disclosures in the following: U.S. Pat. No. 4,261,791, issued to Schwartzman on Apr. 14, 1981; U.S. Pat. No. 4,711,256, issued to Kaiser on Dec. 8, 1987; and U.S. Pat. No. 4,828,751, issued to Kremer on May 9, 1989.

SUMMARY OF THE INVENTION

Now, an improved method has been discovered for reducing foreign particulate matter on a surface, particularly a surface of a semiconductor wafer. In accordance with the invention, the surface to be treated is contacted with a solution comprising a strong acid and a very small amount of a fluorine-containing compound, which is effective in reducing foreign particulate matter contamination, without significant etching, of the surface. In a preferred method, there is employed a solution which further contains an oxidizing agent, such as hydrogen peroxide, and in which the fluorine-containing compound is hydrofluoric acid.

In the practice of the invention, a substantial reduction, e.g. an order of magnitude or greater, in the foreign particulate matter concentration on the surface being treated has been achieved.

It should be noted that various etching solutions are known which contain hydrofluoric acid, such as those disclosed in U.K. Pat. No. 989,025, issued to Philips Electronic and Associated Industries, Ltd. on Apr. 14, 1965 and U.S. Pat. No. 4,100,014, issued to Kuhn-Kuhnenfeld on Jul. 11, 1978. See also U.S. Pat. No. 2,809,103, issued to Alexander on Oct. 8, 1957; U.S. Pat No. 4,220,706, issued to Spak on Sep. 2, 1980; U.S. Pat. No. 4,681,657, issued to Hwang, et al. on Jul. 21, 1987; and U.S. Pat. No. 4,705,760, issued to Kaganowicz on Nov. 10, 1987. Surprisingly, however, in view of these disclosures, it has now been found, that a substantial improvement in reducing foreign particulate matter concentration can be effected without significant etching of the surface being treated. The reduction occurs as a result of removing foreign particulate matter from the surface and repelling further contamination of the surface from the solution itself.

DETAILED DESCRIPTION

As discussed above, the solution employed according to the invention, comprises a strong acid and a very small amount of a fluorine-containing compound. Any suitable strong acid can be employed, such as sulfuric acid, nitric acid and trifluoroacetic acid, although sulfuric acid is preferred. A particularly preferred fluorine-containing compound is hydrofluoric acid.

In carrying out the method, a very small amount of the fluorine-containing compound is employed. This amount is effective in reducing foreign particulate matter contamination of the surface being treated, but without significant etching of the surface. Without being bound by theory, it is believed that this is accomplished by establishing a chemophobic surface upon contacting the surface with the solution, in contrast with a chemophilic surface.

Generally speaking, when a wafer surface is contacted with a conventional cleaning solution, a chemophilic surface is formed, with a residual film of the solution remaining on the surface. Foreign particulate matter from the solution is essentially trapped by the residual film on the surface being cleaned. These particulate contaminants once on the surface resist removal with cleaning solutions ordinarily employed by those skilled in the art. It is believed, however, that the method of the invention provides a chemophobic condition on the surface, where no observable residual film of the solution remains, although tiny droplets may still be present. With this condition, the solution and particulate contaminants are allowed to drain, thus producing a haze-free surface.

It is important to note, however, that although the fluorine-containing compound is employed in an amount which is sufficient to establish a chemophobic surface, it does not cause etching of the surface to a significant extent. In general, the amount is such that the surface being treated is etched at a rate of less than about 20 Å/min., preferably less than about 5 Å/min., and most preferably less than about 2 Å/min.

In general, the exact amount of the fluorine-containing compound that is employed will depend upon the nature of the compound, the temperature of the solution, the contacting time, etc. However, for hydrofluoric acid, the amount will usually range up to about $2.5 \times 10^{-3}$ percent by weight, and more preferably up to about $2 \times 10^{-4}$ percent by weight, based on the weight of the solution.

Various other ingredients may be added to the solution. For example, a suitable oxidizing agent, such as hydrogen peroxide or nitric acid, may be added to further enhance the cleaning rate of the solution, with hydrogen peroxide being preferred. The amount of oxidizing agent employed may vary widely, but it typically ranges from about 5 to about 25 percent, based on the weight of the strong acid in the solution. Other ingredients may be added, depending on the nature of the surface being treated, as well as the nature of the particulate matter. For example, phosphoric acid may be added if particles of silicon nitride are being removed from the surface, as well as standard ingredients such as surfactants.

In carrying out the method of the invention, the wafers are preferably immersed in the solution. Generally, this is performed at a temperature ranging from ambient to about 150° C., and preferably from about 90° to about 115° C., and for a period of time ranging from about a few seconds to about 10 minutes. The actual temperature and time will vary, however, depending on a number of factors, such as the exact formulation of the solution, the nature of the surface being treated and of the particulate matter being removed, and so forth, as will be apparent to those skilled in the art.

Generally, the wafers are then rinsed, preferably with deionized water. Typically, this is performed in two steps, first with hot deionized water, such as at a temperature ranging from about 30° to about 90° C., preferably from about 40° to about 50° C., for about 1 to about 10 minutes, followed by a final rinse, at a temperature ranging from about 20° C. to about 25° C. for about 1 to about 10 minutes. Then, the wafers are usually subjected to a drying step, such as in a centrifuge.

In addition, it should be noted that besides treating silicon-containing surfaces, such as silicon and silicon oxide, the method of the invention can be effectively used in treating a wide variety of surfaces of other substrates, such as oxides, metals, glasses, etc.

The following examples are provided to illustrate the invention.

EXAMPLES 1–12

Oxide coated silicon wafers (Examples 1-6) or bare silicon monitor wafers (Examples 7-12) were contacted with solutions, containing sulfuric acid, hydrogen peroxide and varying amounts of hydrofluoric acid, as outlined in TABLE I below. The procedure involved first immersing the wafers in the solutions at 100° C. for 10 minutes. After that, the wafers were rinsed with deionized water at 45° C. for 5 minutes. This was followed by another rinse, again with deionized water, but at a temperature of 22° C. for 5 minutes. The wafers were then spun dry for 4 minutes in hot flowing air. In each case, it was found that the oxide etch rate was less than 2 Å/min., and a hydrophobic surface was established, with no noticeable surface haze after 7 days. The results of these tests are summarized in TABLE II below.

TABLE I

| Wafer Group and Example No. | Ingredient (% by Wt.) | | |
| --- | --- | --- | --- |
| | $H_2SO_4$ | $H_2O_2$ | HF |
| 1 | 88.9 | 11.1 | $1.3 \times 10^{-4}$ |
| 2 | 88.9 | 11.1 | $6.5 \times 10^{-5}$ |
| 3 | 88.9 | 11.1 | $1.3 \times 10^{-5}$ |
| 4 | 88.9 | 11.1 | $6.5 \times 10^{-6}$ |
| 5 | 88.9 | 11.1 | $1.3 \times 10^{-6}$ |
| 6 | 88.9 | 11.1 | Trace |
| 7 | 88.9 | 11.1 | Trace |
| 8 | 88.9 | 11.1 | $1.3 \times 10^{-6}$ |
| 9 | 88.9 | 11.1 | $6.5 \times 10^{-6}$ |
| 10 | 88.9 | 11.1 | $1.3 \times 10^{-5}$ |
| 11 | 88.9 | 11.1 | $6.5 \times 10^{-5}$ |

TABLE I-continued

| Wafer Group and Example No. | Ingredient (% by Wt.) | | |
| --- | --- | --- | --- |
| | $H_2SO_4$ | $H_2O_2$ | HF |
| 12 | 88.9 | 11.1 | $1.3 \times 10^{-4}$ |

TABLE II

| Wafer Group and Example No. | Oxide Etch Rate[1] (Ang./min.) | Surface Characteristics (Chemophobic vs. Chemophilic) | Surface Haze (After 7 days) |
| --- | --- | --- | --- |
| 1 | 1.35 | Chemophobic | No |
| 2 | 0.55 | Chemophobic | No |
| 3 | 0.05 | Chemophobic | No |
| 4 | 0 | Chemophobic | No |
| 5 | −0.05 | Chemophobic | No |
| 6 | −0.05 | Slightly Chemophobic | No |
| 7 | −0.36 | Slightly Chemophobic | No |
| 8 | −0.34 | Chemophobic | No |
| 9 | −0.32 | Chemophobic | No |
| 10 | −0.32 | Chemophobic | No |
| 11 | −0.31 | Chemophobic | No |
| 12 | −0.36 | Chemophobic | No |

[1](A negative number indicates oxide growth rate).

EXAMPLE 13 AND COMPARATIVE EXAMPLES A AND B

In each of these examples, the procedure of Example 1 was followed, except that the wafers were bare silicon monitor wafers, and after the wafers were spun dry, a 4000 Å thick layer of polysilicon was deposited by standard CVD techniques. In Example 13, the solution contained sulfuric acid, hydrogen peroxide and hydrofluoric acid, while in Comparative Examples A and B, the solutions contained sulfuric acid and hydrogen peroxide, but no hydrofluoric acid was added. The compositions of the solutions are outlined in TABLE III below.

Particle counts were then determined, by employing a TENCOR Model 4000 or Model 5500 measurement tool (commercially available from Tencor Instruments, Mountain View, Calif.). The resulting particle counts are summarized in TABLE IV below. It should be noted that the numerical result indicates the number of particles on the wafer having a size of 0.7 or 1.2 $\mu$, respectively, or larger, measured in cross-sectional area. As shown in TABLE IV, the use of the solution of Example 13 showed a substantial reduction in foreign particulate matter concentration, as compared with the use of the standard $H_2SO_4/H_2O_2$ cleaning solution. In addition, the wafer treated with the solution in Example 13 did not show a noticeable haze after 90 days, while the wafers treated with the solutions in Comparative Examples A and B did show a noticeable haze after only 2 days.

TABLE III

| Example or Comparative Example No. | Ingredient (% by Weight | | |
| --- | --- | --- | --- |
| | $H_2SO_4$ | $H_2O_2$ | HF |
| 13 | 88.9 | 11.1 | $6.5 \times 10^{-5}$ |
| A | 88.9 | 11.1 | 0 |
| B | 88.9 | 11.1 | 0 |

TABLE IV

| Example Or Comparative Example No. | Particulate Matter Concentration 1.2 u | Particulate Matter Concentration 0.7 u | Surface Haze (After 2 Days) |
| --- | --- | --- | --- |
| 13 | 3 | 14 | No |
| A | 29 | 408 | Yes |
| B | 14 | 393 | Yes |

EXAMPLES 14 AND 15 AND COMPARATIVE EXAMPLES C AND D

In each of these examples, the procedure of Example 1 was followed, except that the wafers were bare silicon monitor wafers, and after the wafers were spun dry, a 4000 Å thick layer of polysilicon was deposited by standard CVD techniques. In Examples 14 and 15, the solution contained sulfuric acid, hydrogen peroxide and hydrofluoric acid, while in Comparative Examples C and D, the solutions contained sulfuric acid and hydrogen peroxide, but no hydrofluoric acid was added. The compositions of the solutions are outlined in TABLE V below.

Particle counts were then determined, by employing a TENCOR Model 4000 or Model 5500 measurement tool (commercially available from Tencor Instruments, Mountain View, Calif.). The resulting particle counts are summarized in TABLE VI below. It should be noted that the numerical result indicates the number of particles on the wafer having a size of 0.7 or 1.2 $\mu$, respectively, or larger, measured in cross-sectional area. As shown in TABLE VI, the use of the solutions of Examples 14 and 15 showed a substantial reduction in foreign particulate matter concentration, as compared with the use of the standard $H_2SO_4/H_2O_2$ cleaning solution. In addition, the wafers treated with the solutions in Examples 14 and 15 did not show a noticeable haze after 90 days, while the wafers treated with the solutions in Comparative Examples C and D did show a noticeable haze after only 2 days.

TABLE V

| Example or Comparative Example No. | Ingredient (% by Weight) $H_2SO_4$ | Ingredient (% by Weight) $H_2O_2$ | Ingredient (% by Weight) HF |
| --- | --- | --- | --- |
| 14 | 88.9 | 11.1 | $6.5 \times 10^{-5}$ |
| 15 | 88.9 | 11.1 | $6.5 \times 10^{-5}$ |
| C | 88.9 | 11.1 | 0 |
| D | 88.9 | 11.1 | 0 |

TABLE VI

| Example Or Comparative Example No. | Particulate Matter Concentration 1.2 u | Particulate Matter Concentration 0.7 u | Surface Haze (After 2 Days) |
| --- | --- | --- | --- |
| 14 | 10 | 106 | No |
| 15 | 7 | 72 | No |
| C | 2,998 | 12,075 | Yes |
| D | 740 | 32,000+ | Yes |

We claim:

1. A method of reducing foreign particulate matter concentration on a surface, which comprises contacting said surface with a solution comprising a strong acid and a very small amount of a fluorine-containing compound, which is effective in reducing foreign particulate matter contamination, without significant etching, of said surface, wherein said amount of said fluorine-containing compound is sufficient to establish a chemophobic surface, and said surface is etched at a rate of less than about 20 Å/min.

2. The method of claim 1, wherein said surface is etched at a rate of less than about 5 Å/min.

3. The method of claim 2, wherein said surface is etched at a rate of less than about 2 Å/min.

4. The method of claim 1, wherein said fluorine-containing compound is hydrofluoric acid.

5. The method of claim 1, wherein said strong acid is selected from the group consisting of sulfuric acid, nitric acid and trifluoroacetic acid.

6. The method of claim 5, wherein said strong acid is sulfuric acid.

7. The method of claim 1, wherein said solution further comprises an oxidizing agent.

8. The method of claim 7, wherein said oxidizing agent is hydrogen peroxide.

9. The method of claim 8, wherein said strong acid is sulfuric acid and said fluorine-containing compound is hydrofluoric acid.

10. The method of claim 9, wherein said solution contains hydrofluoric acid in an amount of up to about $2.5 \times 10^{-3}$ percent by weight.

11. The method of claim 10, wherein said solution contains hydrofluoric acid in an amount of up to about $2 \times 10^{-4}$ percent by weight.

12. A method of reducing foreign particulate matter concentration on a surface of a semiconductor wafer, which comprises immersing said wafer in a solution comprising a strong acid selected from the group consisting of sulfuric acid, nitric acid and trifluoroacetic acid and a very small amount of hydrofluoric acid, which is effective in reducing foreign particulate matter contamination, without significant etching, of said surface, wherein said amount of hydrofluoric acid is sufficient to establish a chemophobic surface, and said surface is etched at a rate of less than about 5 Å/min.

13. The method of claim 12, wherein said strong acid is sulfuric acid, and said solution further comprises hydrogen peroxide.

14. The method of claim 13, wherein said wafer is immersed in said solution for a period of time ranging from about a few seconds to about 10 minutes, and wherein said solution is maintained at a temperature ranging from about 90° to about 115° C.

15. The method of claim 14, wherein said solution contains hydrofluoric acid in an amount of up to about $2 \times 10^{-4}$ percent by weight, and said surface is etched at a rate of less than about 2 Å/min.

* * * * *